US008704803B2

(12) United States Patent
Koyama et al.

(10) Patent No.: US 8,704,803 B2
(45) Date of Patent: Apr. 22, 2014

(54) DISPLAY DEVICE AND ELECTRONIC APPLIANCE USING THE DISPLAY DEVICE

(75) Inventors: Jun Koyama, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 698 days.

(21) Appl. No.: 11/201,088

(22) Filed: Aug. 11, 2005

(65) Prior Publication Data

US 2006/0044300 A1 Mar. 2, 2006

(30) Foreign Application Priority Data

Aug. 27, 2004 (JP) ................................. 2004-248826

(51) Int. Cl.
*G09G 5/00* (2006.01)
(52) U.S. Cl.
USPC ........................................................ 345/204
(58) Field of Classification Search
USPC ......... 345/207, 418, 619, 157, 593, 169, 690; 362/276
See application file for complete search history.

(56) References Cited

U.S. PATENT DOCUMENTS

| | | | | |
|---|---|---|---|---|
| 5,052,776 A | * | 10/1991 | Fukushima et al. | ......... 385/120 |
| 5,603,104 A | * | 2/1997 | Phelps et al. | ................. 455/90.3 |
| 7,002,593 B2 | | 2/2006 | Milch et al. | |
| 7,259,769 B2 | * | 8/2007 | Diefenbaugh et al. | ........ 345/604 |
| 7,724,247 B2 | * | 5/2010 | Yamazaki et al. | ............ 345/207 |
| 2001/0012399 A1 | * | 8/2001 | Tohyama et al. | ............. 382/167 |
| 2002/0024529 A1 | * | 2/2002 | Miller et al. | .................... 345/690 |
| 2002/0180752 A1 | * | 12/2002 | Chernega et al. | ............. 345/589 |
| 2003/0103037 A1 | * | 6/2003 | Rotzoll | ......................... 345/157 |
| 2003/0142085 A1 | * | 7/2003 | Taniguchi et al. | ............. 345/204 |
| 2003/0231161 A1 | * | 12/2003 | Yamaguchi | .................... 345/102 |
| 2004/0201583 A1 | | 10/2004 | Burroughes et al. | |
| 2004/0246242 A1 | * | 12/2004 | Sasaki | ............................ 345/204 |
| 2004/0263485 A1 | * | 12/2004 | Ho et al. | ....................... 345/173 |

(Continued)

FOREIGN PATENT DOCUMENTS

EP 1308921 A2 5/2003
JP 56154790 A 11/1981

(Continued)

OTHER PUBLICATIONS

Office Action (Chinese Application No. 200510091587.2) mailed Feb. 15, 2008 with English translation, 15 pages.

*Primary Examiner* — Quan-Zhen Wang
*Assistant Examiner* — Tony Davis
(74) *Attorney, Agent, or Firm* — Fish & Richardson P.C.

(57) ABSTRACT

In case of a display device using a light emitting element, there is a problem that visibility is extremely decreased under strong outside light when outside light is stronger than light emitted from the light emitting element. According to the present invention, an optical sensor is incorporated to detect an intensity of outside light by monitoring outside light. In the case where strong outside light is detected, a background image of the display device is displayed in black so as to improve visibility of a display image. Besides, luminance of the display image is heightened to improve the visibility further.

54 Claims, 11 Drawing Sheets

(56) References Cited

U.S. PATENT DOCUMENTS

| | | | |
|---|---|---|---|
| 2005/0024339 A1* | 2/2005 | Yamazaki et al. | 345/169 |
| 2005/0037815 A1* | 2/2005 | Besharat et al. | 455/566 |
| 2005/0041009 A1* | 2/2005 | Kuroda | 345/102 |
| 2005/0062680 A1* | 3/2005 | Lee et al. | 345/10 |
| 2005/0104805 A1* | 5/2005 | Masaki | 345/46 |
| 2005/0117192 A1* | 6/2005 | Enomoto et al. | 359/265 |
| 2005/0146600 A1* | 7/2005 | Chipchase et al. | 348/14.02 |
| 2005/0212824 A1* | 9/2005 | Marcinkiewicz et al. | 345/690 |
| 2005/0225983 A1* | 10/2005 | Fornell | 362/276 |
| 2005/0248264 A1* | 11/2005 | Cok | 313/504 |
| 2006/0170669 A1* | 8/2006 | Walker et al. | 345/418 |

FOREIGN PATENT DOCUMENTS

| | | |
|---|---|---|
| JP | 3023493 A | 1/1991 |
| JP | 06-339087 | 12/1994 |
| JP | 11352950 A | 12/1999 |
| JP | 2000310983 A | 11/2000 |
| JP | 2001-326710 | 11/2001 |
| JP | 2002511608 A | 4/2002 |
| JP | 2002199078 A | 7/2002 |
| JP | 2003216092 A | 7/2003 |
| JP | 2004294775 A | 10/2004 |
| WO | 1999053472 A1 | 10/1999 |

* cited by examiner

DISPLAY DEVICE AND ELECTRONIC APPLIANCE USING THE DISPLAY DEVICE

BACKGROUND OF THE INVENTION

1. Field of the Invention

The present invention relates to a display device, especially to that having a light emitting element. The invention also relates to electronic appliances including the display device having the light emitting element.

2. Description of the Related Art

Recently, mobile phones have been used widely with the advance in communication technology. It is anticipated that moving images and much more information will be transmitted using mobile phones in future. Meanwhile, personal computers (PCs) that are portable have been produced, owing to reduction in weight thereof. A large number of personal digital assistants referred to as PDAs have been produced beginning from an electronic organizer so that they are in course of being popularized. Further, a flat panel display is mounted on most of the portable information appliances, owing to the development of the display device.

Furthermore, recently, commercialization of the display device using a thin film transistor using low-temperature polysilicon (hereinafter, a thin film transistor is referred to as a TFT) has been proceeded among active matrix display devices. In case of using the low-temperature polysilicon TFT, it is possible that a signal line driver circuit is formed on the periphery of a pixel portion over the same substrate as the pixel portion; therefore, the display device can be downsized and defined highly and it is expected to be used more widely.

Figure 2A:
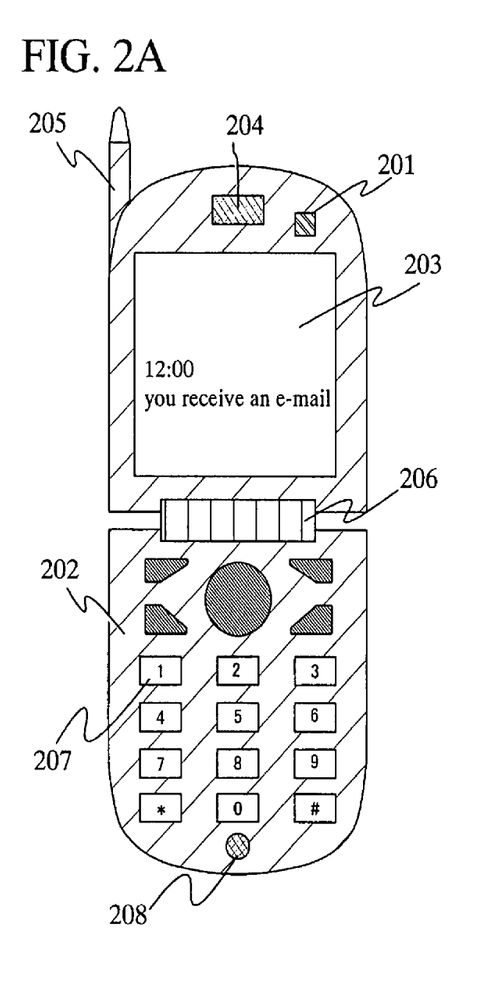
FIG. 2A is a view showing a conventional mobile phone.

In case of a mobile phone, a folding type one has been taking the place of a bar type one. Such a folding type mobile phone is shown in FIG. 2A, which includes a first housing 201, a second housing 202, a display portion 203, a speaker 204, an antenna 205, a hinge 206, an operating key 207 and a microphone 208 (see Japanese Patent Laid-Open No. 2001-326710, for example).

Figure 2B:
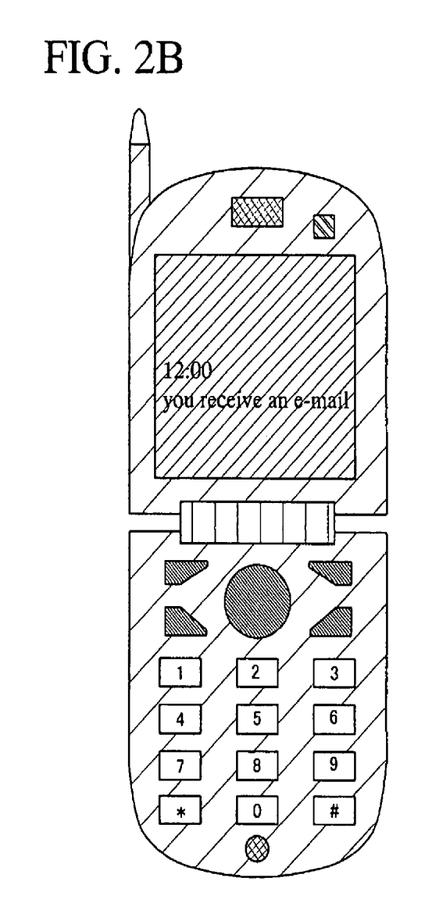
FIG. 2B is a view showing the conventional mobile phone (in case where outside light is strong).

In case of the mobile phone using a conventional light emitting element, there was a problem that images could not be seen because, under strong outside light such as sunlight, the outside light was stronger than light emitted from the light emitting element. As shown in FIG. 2B, color of display on the display screen seems almost black by strong outside light when seen by a user. In case of a display device using a liquid crystal, this problem is solved by utilizing a reflective liquid crystal display device. However, it was a problem that a basically similar solution can not be applied to the display device using the light emitting element.

SUMMARY OF THE INVENTION

The invention is made in view of the abovementioned problems to provide a display device using the light emitting element, in which images on the display screen can be seen under strong outside light, and an electronic appliance utilizing the display device.

A feature of the invention is that luminance of a background image on a display screen of a display device including a light emitting element is changed in accordance with intensity of outside light, that is, environmental brightness to improve visibility. In brief, the invention provides a display device comprising a sensor for detecting the intensity of outside light, that is, the environmental brightness and a controller for changing luminance of the background image and luminance of the display image on the display screen (letters, figures, marks and the like) in accordance with the detected result of the sensor, and an electronic appliance using the display device.

According to the invention, in the case where higher intensity than a predetermined intensity is detected by the sensor, the background image on the display screen is converted from white to a color close to black by the controller. Then, the display image is displayed brightly in white or a color close to white by the controller. Display image can be displayed clearly by switching a state of the display screen in accordance with the environmental brightness. Further, the number of pixels emitting light brightly decreases by displaying the background image in black or the color close to black and letters, figures, marks and the like in white or the color close to white. Therefore, electricity necessary for displaying images can be focused on the pixels emitting light. Thereby visibility of the display screen can be improved further.

One mode of the invention is a display device comprising a display screen comprising a plurality of light emitting elements arranged in matrix over a substrate, an optical sensor for detecting outside light, a controller for controlling luminance of a background image on the display screen in accordance with an output detected by the optical sensor.

One mode of the invention is a display device comprising a display screen comprising a plurality of light emitting elements arranged in matrix over a substrate, an optical sensor for detecting outside light, a controller for controlling luminance of a background image and a display image on the display screen in accordance with the output detected by the optical sensor.

With respect to the foregoing, it is preferable that luminance of the background image in the case where intensity of outside light is 3000 Lux or more is lower than that of the background image in the case where intensity of outside light is less than 3000 Lux. In brief, it is preferable that the display device comprises a controller which controls luminance of the background image on the display screen when surrounding light is bright so as to be lower than that of the background image on the display screen when surrounding light is dark.

With respect to the foregoing, it is preferable that luminance of the display image in the case where intensity of outside light is 3000 Lux or more is higher than that of the display image in the case where intensity of outside light is less than 3000 Lux. In brief, it is preferable that the display device comprises a controller which controls luminance of the letters, the figures and the marks on the display screen when surrounding light is bright so as to be higher than that of the letters, the figures and the marks on the display screen when surrounding light is dark.

With respect to the foregoing, it is preferable that the optical sensor is formed over the same substrate as the light emitting elements.

Accordingly, a display device whose display image is easily recognized can be made by displaying the background image in black and the display image in white on the screen, and an electronic appliance realizing high visibility under strong outside light can be made. Further, electricity can be focused on the pixels for displaying the display image by displaying the background image in black and the display image in white on the screen, and higher visibility can be realized.

This application is based on Japanese Patent Application serial no. 2004-248826 filed in Japan Patent Office on 27, Aug. 2004, the entire contents of which are hereby incorporated by reference.

DETAILED DESCRIPTION OF THE INVENTION

Although the present invention will be fully described by way of embodiment modes and embodiments with reference to the accompanying drawings, it is to be understood that various changes and modifications will be apparent to those skilled in the art. Therefore, unless otherwise such changes and modifications depart from the scope of the present invention, they should be construed as being included therein.

Figure 3:
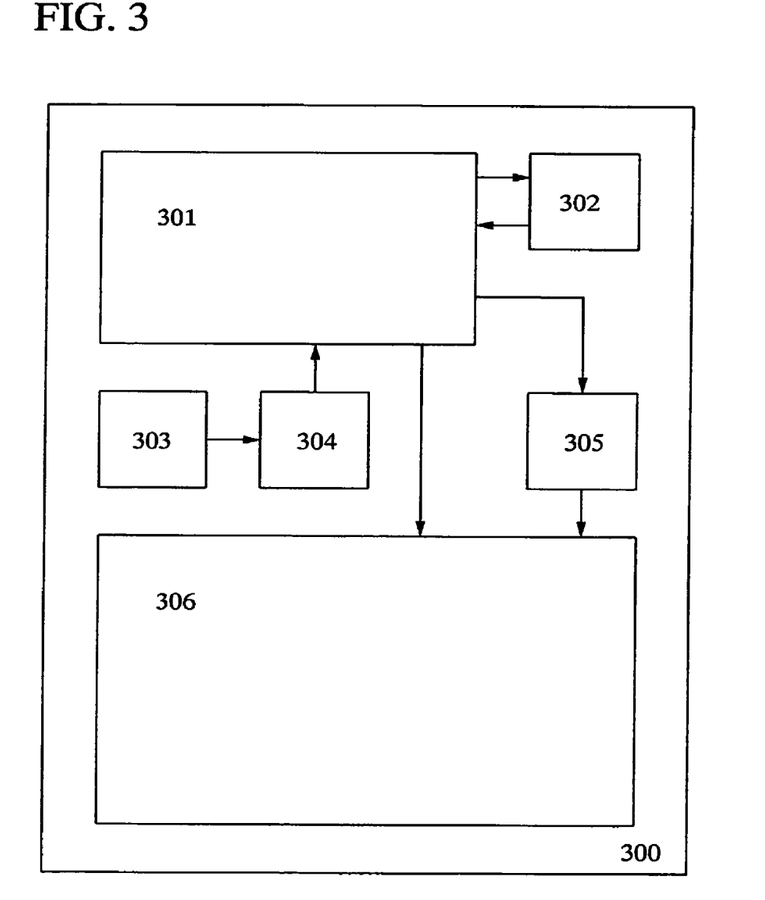
FIG. 3 is a diagram showing an embodiment mode of the invention.

An embodiment mode of the invention is shown in FIG. 3. FIG. 3 is a block diagram of a display device using the invention. A display device 300 in this embodiment mode includes a controller 301, a memory 302, an optical sensor 303, an amplifier 304, a power supply 305 and a panel 306. The controller 301 generates signals necessary for the panel 306 by a control signal and an image signal that are inputted from the external. The memory 302 is mainly used for temporarily memorizing the image signal, however, it can also be used for the other purpose. The optical sensor 303 detects outside light (light outside of the display device 300). Although the amplifier 304 amplifies an output signal from the optical sensor 303 and transmits to the controller 301, the device can be configured without the amplifier in the case where an output signal from the optical sensor 303 is sufficiently large. The power supply 305 supplies voltage and current that are necessary for the panel 306. The panel 306 uses a light emitting element, and an electroluminescence (EL) element and a FED (field emission display) may be also used for it.

When the optical sensor 303 receives intense outside light, the signal is transmitted to the controller 301 through the amplifier 304. The controller 301 transmits the signals to the panel 306 according to the intense of the signals so as to change luminance or convert color of the background image in the panel 306.

Specifically, in the case where the outside light is weak, the background image is displayed in white or a color close to white and the display image is displayed in black or a color close to black. In the case where the outside light grows stronger, the background image is displayed in black or a color close to black and the display images is displayed in white or a color close to white.

In addition, in the case where the outside light is strong, electricity for emitting light to display the background image is declined because the background image is displayed in black. The electricity left unconsumed can be utilized to increase luminance of the display image. In this way, visibility under strong outside light can be improved.

In such a case, a control signal for increasing luminance is transmitted from the controller 301 to the power supply 305 so as to increase luminance. Note that, the controller 301 may include a combination of at least one control circuit.

Figure 1A:
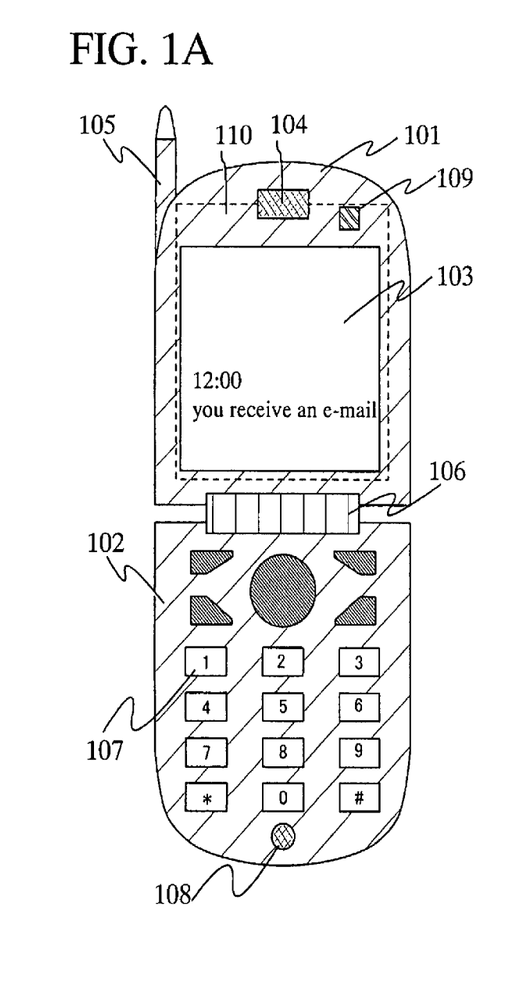
FIG. 1A is a view showing a mobile phone using the invention.
Figure 1B:
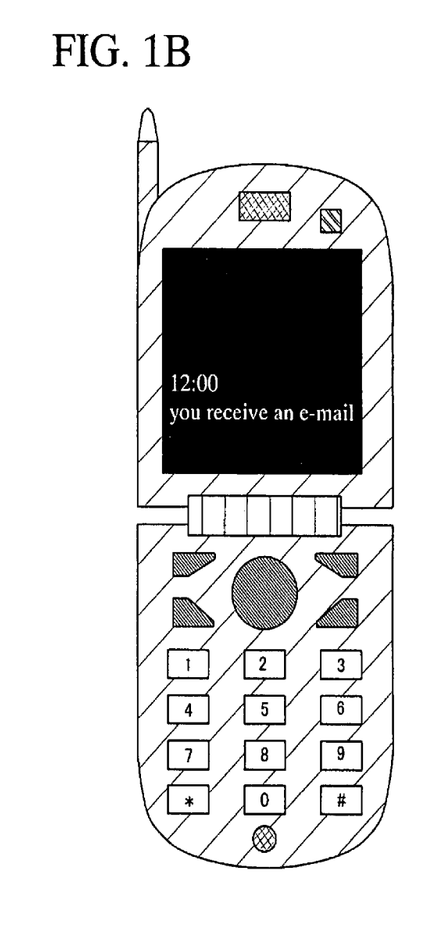
FIG. 1B is a view showing the mobile phone using the invention (in case where outside light is strong).

An embodiment mode of a mobile phone using the display device of the invention is shown in FIGS. 1A and 1B. The mobile phone shown in the FIG. 1A includes a first housing 101, a second housing 102, a display screen 103, a speaker 104, an antenna 105, a hinge 106, a control key 107, a microphone 108, an optical sensor 109 and a substrate 110. The display device of the invention is mounted in the first housing 101. Note that, although the display screen 103 and the optical sensor 109 are formed over the substrate 110 in FIGS. 1A and 1B, they may not be formed over the same substrate.

FIG. 1A shows a display image in the case where outside light is weak. Black letters in the white background image are displayed on the display screen 103. When outside light is weak, sensitiveness of eyes is adjusted to light emitting luminance of the display screen. When outside light is strong, outside light is brighter than the white background image so that the intensity of outside light is detected by the optical sensor 109 to convert the background image from white to black as shown in FIG. 1B. In this way, an area emitting light can be reduced by displaying the background image in black. Therefore, electricity can be consumed for a small part displayed in white so as to display it more clearly. Note that, in this specification, the strong outside light means the light that is 3000 Lux or more (preferably 5000 Lux or more).

Although the mobile phone is shown in the embodiment mode, the invention is not limited to this. The invention can be utilized for various electronic appliances using a display device such as a PDA (Personal Digital Assistant), a video camera, a digital camera, a portable DVD (Digital Versatile Disc), a portable television, a game machine, and a computer.

Embodiment 1

Figure 4A:
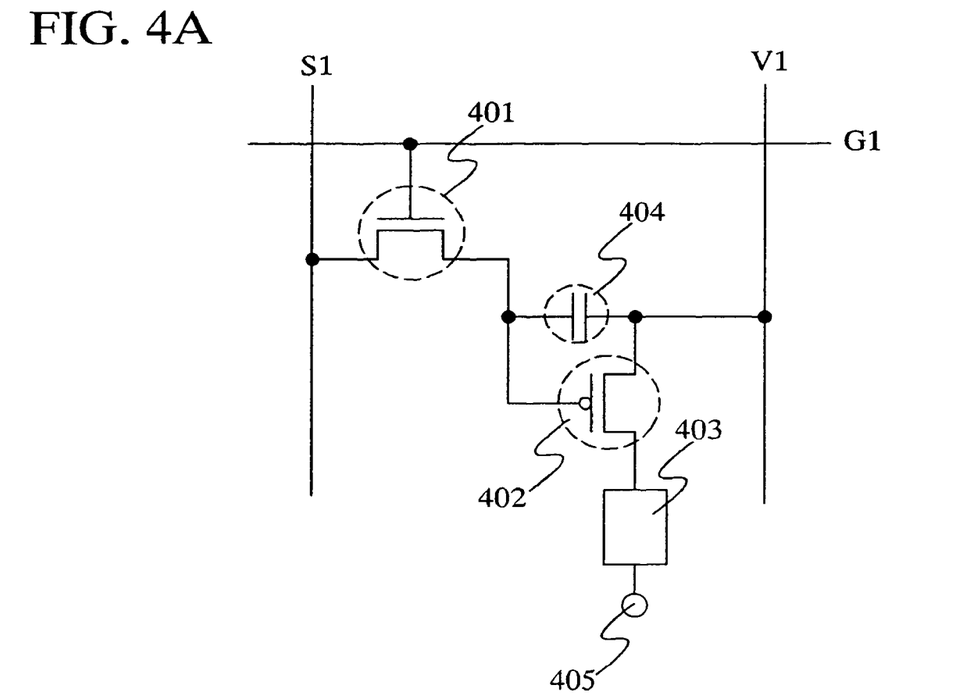
FIG. 4A is a diagram showing a pixel of an active matrix light emitting device.
Figure 4B:
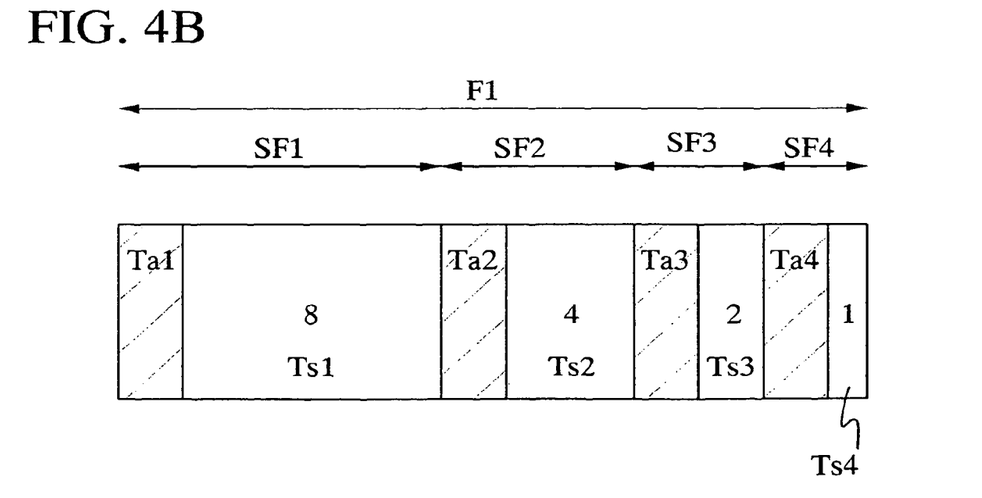
FIG. 4B is a timing chart.

An example of a pixel of a time gray scale light emitting device is shown in FIGS. 4A and 4B. FIG. 4A shows a pixel in which a light emitting element 403 is driven at the time gray scale. The pixel includes a light emitting element 403, a driving TFT 402, a storage capacitor 404, a counter electrode 405, and a switching TFT 401. A gate of the switching TFT 401 is connected to a gate signal line G1. When the gate signal line G1 is high, the switching TFT 401 is turned on so as to write data of a source signal line S1 into the storage capacitor 404 and a gate of the driving TFT 402. When the driving TFT 402 is turned on, current flows from a power supply line V1 to the light emitting element 403 through the driving TFT 402. This state is maintained until next writing is carried out. Further the light emitting element 403 is connected to the counter electrode 405.

Note that, in this specification, connection means electrical connection.

A timing chart of a time gray scale is shown in FIG. 4B. As an example for an explanation, a 4-bit is taken, however, the invention is not limited to 4-bit. One frame includes four subframes SF1 to SF4. The subframes include address periods (writing period) Ta1 to Ta4 and sustain periods (lighting period) Ts1 to Ts4. The sustain time periods are provided to be Ts1:Ts2:Ts3:Ts4=8:4:2:1. Therefore, the bits adjust to respective sustain periods so that the time gray scale is enabled. At each of the address time periods, light is not emitted and only an addressing is performed.

Figure 6:
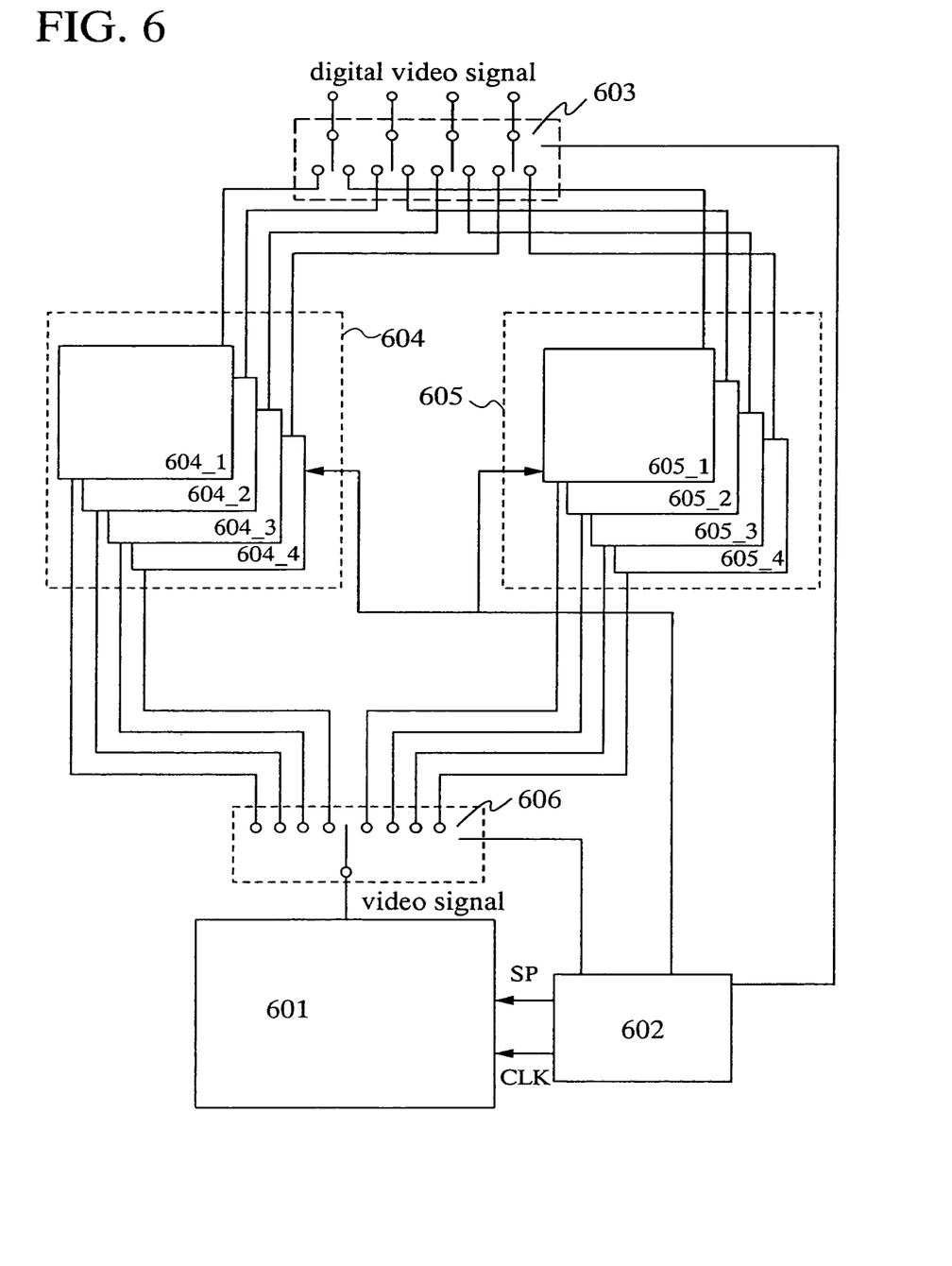
FIG. 6 is a block diagram of a controller.

A control circuit and a memory circuit that are for forming subframes are required so as to carry out such a time gray scale driving. A control circuit and a memory circuit are shown in FIG. 6. Although subframes are provided corresponding to a 4-bit digital video signal in this embodiment, the invention is not especially limited to a 4-bit. Operation is explained below. First, the control circuit 602 inputs digital video signals into a memory A 604 through a switch 603. After data in a first frame is inputted into the memory A 604 completely, a memory B 605 is selected by the switch 603 so as to write digital video signals in a second flame.

On the other hand, a switch 606 is connected to the memories 604_1 to 604_4 sequentially while digital video signals in the second frame are written, and signals stored in the memory A 604 are inputted into a display screen 601. And then, after data in the second frame is inputted into the memory B 605 completely, the memory A 604 is selected by the switch 603 to write digital video signals in a third frame. Further, the switch 606 is connected to memories 605_1 to 605_4 sequentially while the digital video signals in the third frame are written, and signals stored in the memory B 605 are inputted into the display screen 601. Subframes can be formed by repeating the operation mentioned above.

Embodiment 2

Figure 7:
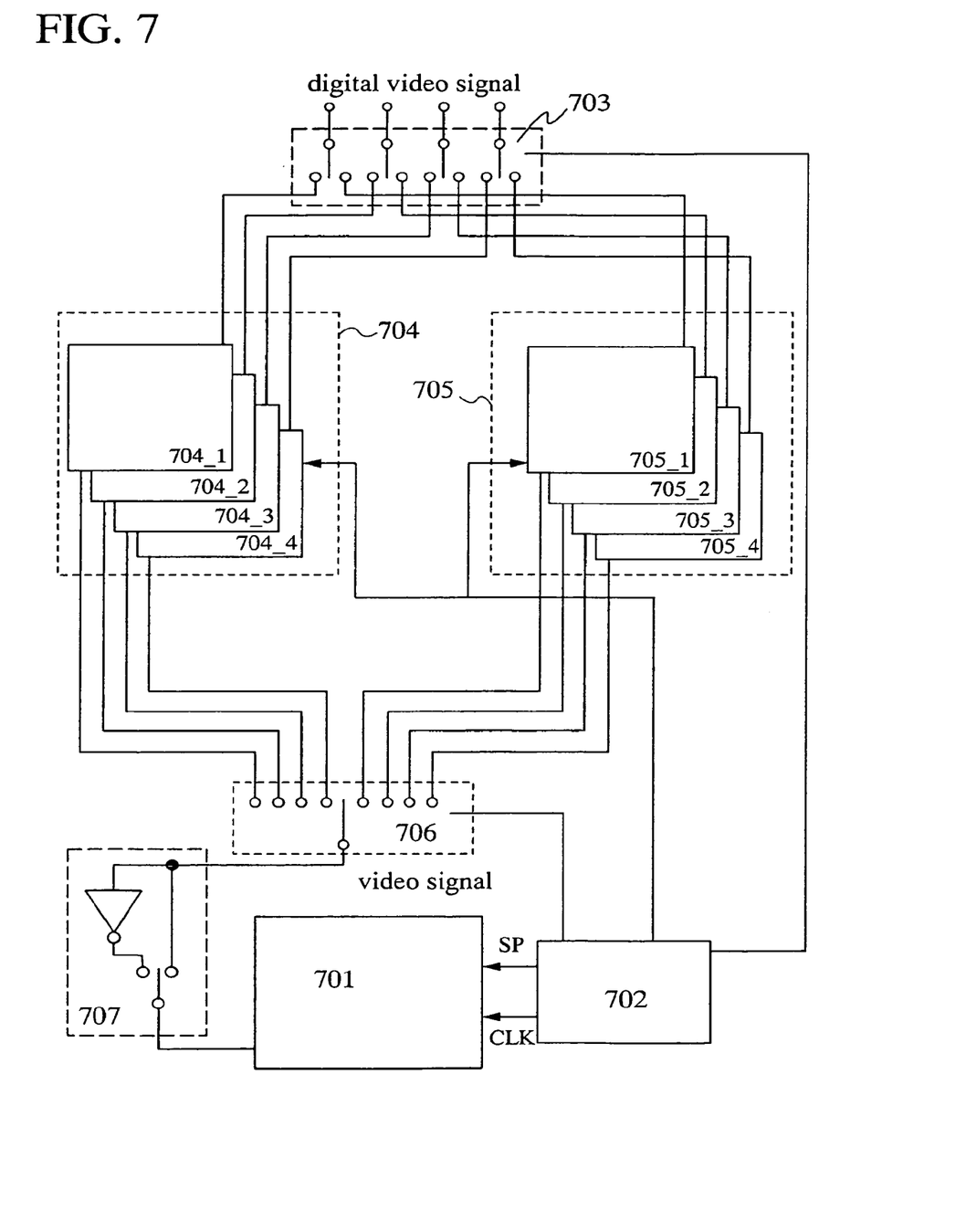
FIG. 7 is a block diagram of a controller.

FIG. 7 is an example of a method of making images in which luminance is changed by inverting signals. By this method, a display of black display image with white background image and a display of white display image with black background image can be achieved. An signals outputted from an image signal selecting switch 706 is inputted into a switch 707, which selects whether the signals from the image signal selecting switch 706 is inverted or not before being inputted into a display screen 701. In the case where luminance needs to be changed, the signals may be inverted before being inputted. Whether the signals need to be inverted or not is chosen by a display controller. Note that, a switch 703 and memories A 704 and B 705 function similarly to the switch 603 and the memories A 604 and B 605 in FIG. 6. Further, memories 704_1 to 704_4 and memories 705_1 to 705_4 function similarly to the memories 604_1 to 604_4 and the memories 605_1 to 605_4 in FIG. 6.

In the invention, the method of changing luminance of the background image or the display image is not limited to this embodiment, and luminance thereof can be changed by another method.

Embodiment 3

An embodiment of the invention is explained with reference to drawings. In this embodiment, a configuration of a display panel which has a display screen and an optical sensor over a substrate is explained in detail.

Figure 8:
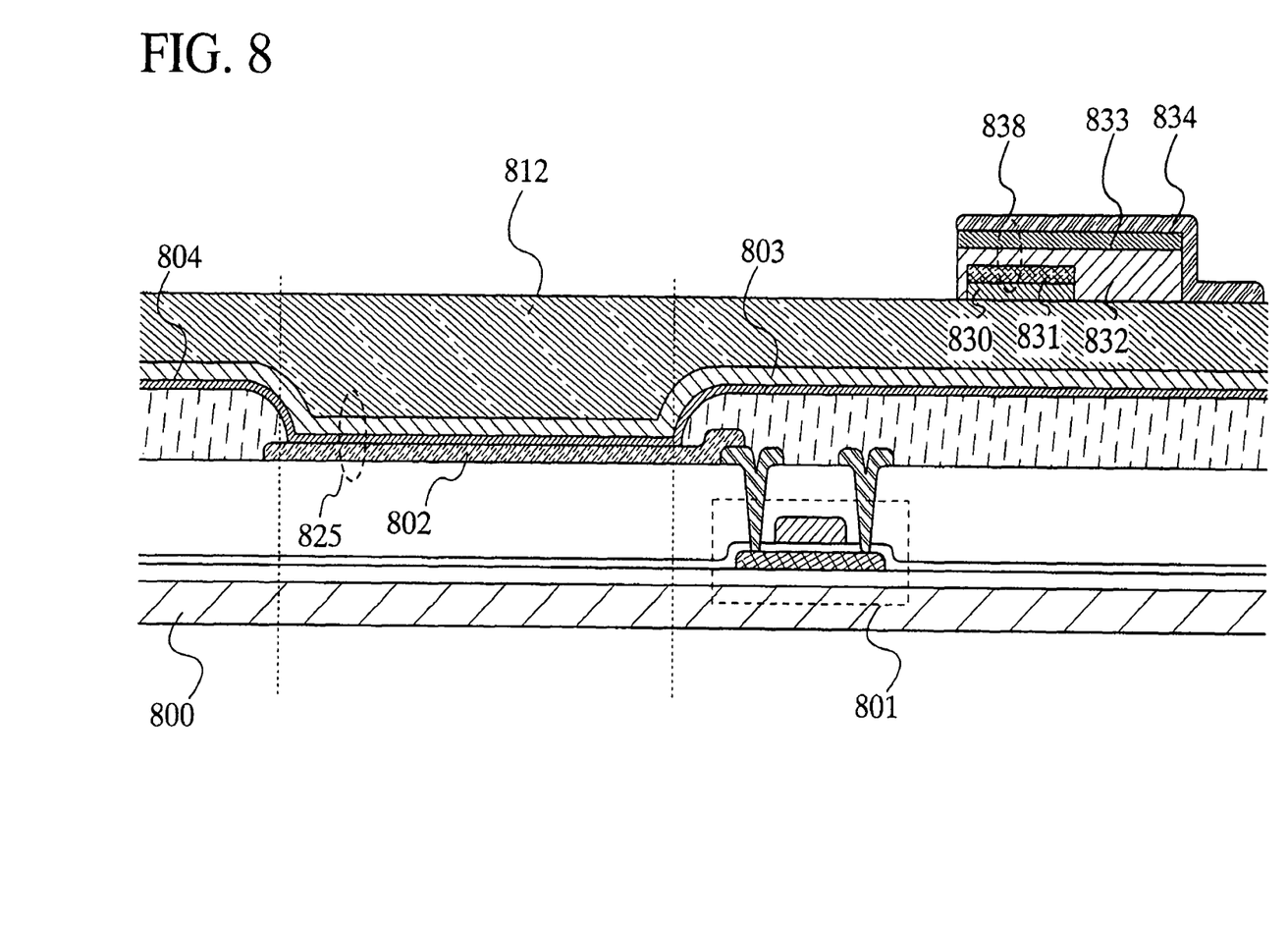
FIG. 8 is a view showing an embodiment in which a sensor is integrated.

In FIG. 8A, a driving transistor 801, a first electrode (pixel electrode) 802, a light emitting layer 803 and a second electrode (counter electrode) 804 formed of a light transmissive material are provided over a substrate 800. A light emitting element 825 emits light upward. In addition, a photoelectric conversion element 838 including a laminated layer of a p-type layer 831, an i-type (genuine) layer 832 and an n-type layer 833, an electrode 830 connected to the p-type layer 831 and an electrode 834 connected to the n-type layer 833 are provided over an insulating film 812 formed over the second electrode 804.

In this embodiment, the photoelectric conversion element 838 is used as an optical sensor. The light emitting element 825 and the photoelectric conversion element 838 are formed over the same substrate 800. Light emitted from the light emitting element 825 configures images perceived by users. On the other hand, the photoelectric conversion element 838 takes on a role of detecting outside light and transmitting detected signals to a controller. In this way, the light emitting element and the optical sensor (photoelectric conversion element) can be integrated over a same substrate, which contributes to downsizing of a device.

Figure 10:
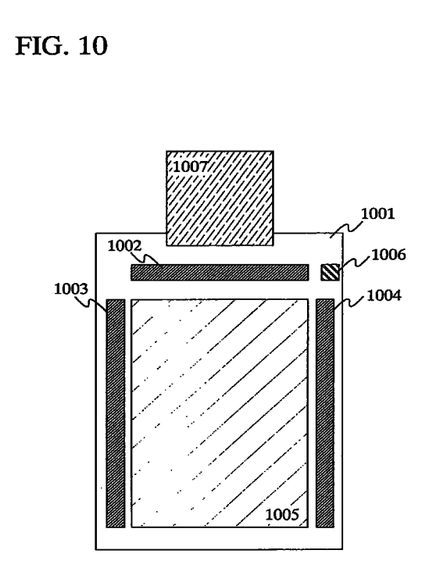
FIG. 10 is a view showing an embodiment in which a sensor is integrated.

FIG. 10 is an example of a case where the optical sensor and a light emitting element are formed over a same substrate. In this embodiment, a source signal line driver circuit 1002, gate signal line driver circuits 1003 and 1004, a pixel portion 1005 and an optical sensor 1006 are formed over a same substrate 1001 with a FPC (flexible print circuit) 1007 attached. Although a cross section view thereof is shown in FIG. 8, a cross sectional form is not limited to this, and other forms may be applied.

Besides, the invention is not limited to the method for integrally forming the optical sensor and the light emitting element over the same substrate. The source signal line driver circuit 1002, the gate signal line driver circuits 1003 and 1004 and the optical sensor 1006 can be attached by COG (chip on glass).

This embodiment can be combined with the embodiment mode and the embodiments 1 and 2 that are mentioned above.

Embodiment 4

Figures 5A, 5B:
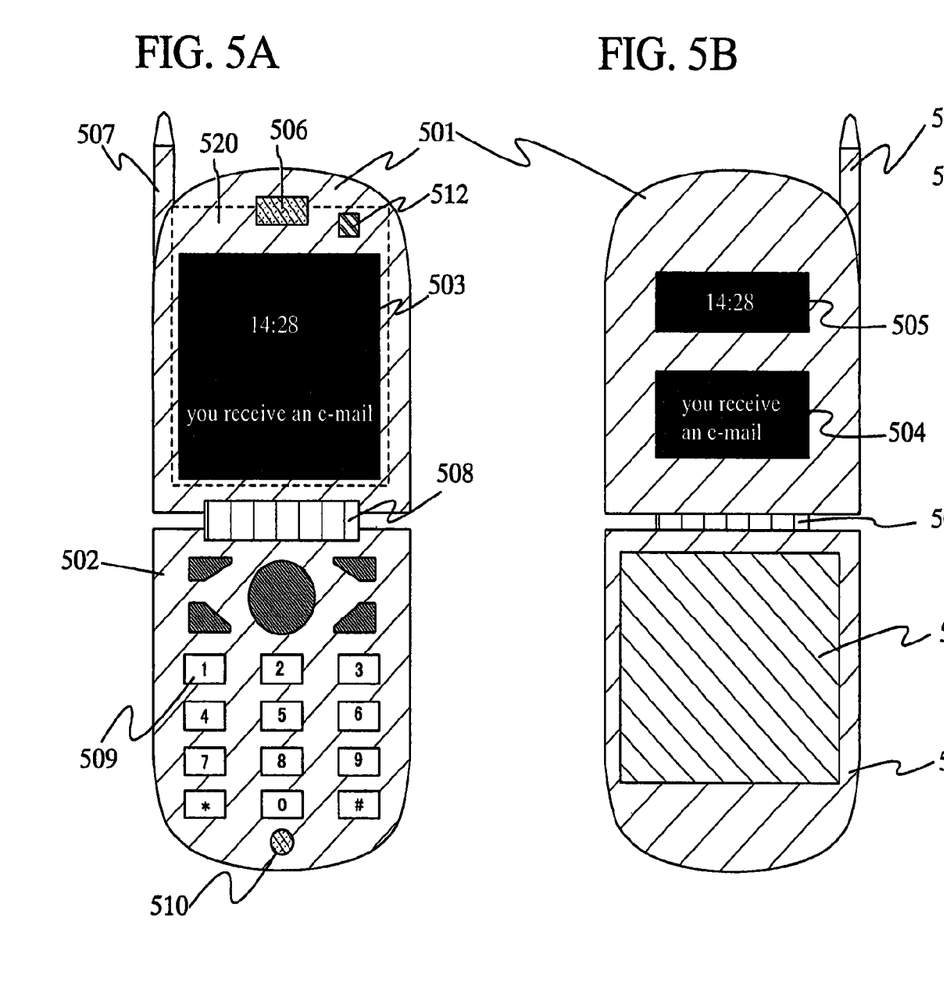
FIG. 5A is a view showing an inner side of a dual emission mobile phone using the invention.
FIG. 5B is a view showing an external side of the dual emission mobile phone using the invention.
Figure 5C:
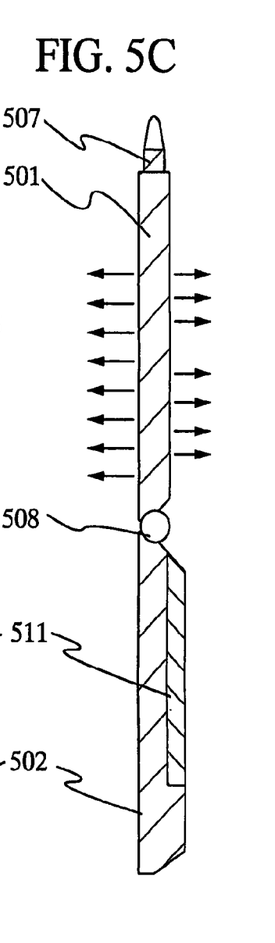
FIG. 5C is a lateral view of the dual emission mobile phone using the invention.

In FIGS. 5A to 5C, an embodiment of a mobile phone using a display device of the invention is shown. A mobile phone shown in FIGS. 5A to 5C includes a first housing 501, a second housing 502, a first display screen 503, a second display screen 504, a third display screen 505, a speaker 506, an antenna 507, a hinge 508, an operating key 509, a microphone 510, a battery 511, an optical sensor 512, and a substrate 520. FIGS. 5A to 5C show a state that the background image is black under strong outside light. FIG. 5A shows an inner side of the mobile phone, FIG. 5B shows an outer side thereof, and FIG. 5C shows a lateral side thereof. The display device of the invention is mounted in the first housing 501. Note that, although the optical sensor 512 and the first display screen 503 are formed over the substrate 520, they may not be formed over the same substrate.

In addition, although two display screens (that is, the second display screen 504 and the third display screen 505) for subdisplay are arranged in FIGS. 5A to 5C, the number of them is not limited to two. The number may be one, or may be three or more.

Figure 9:
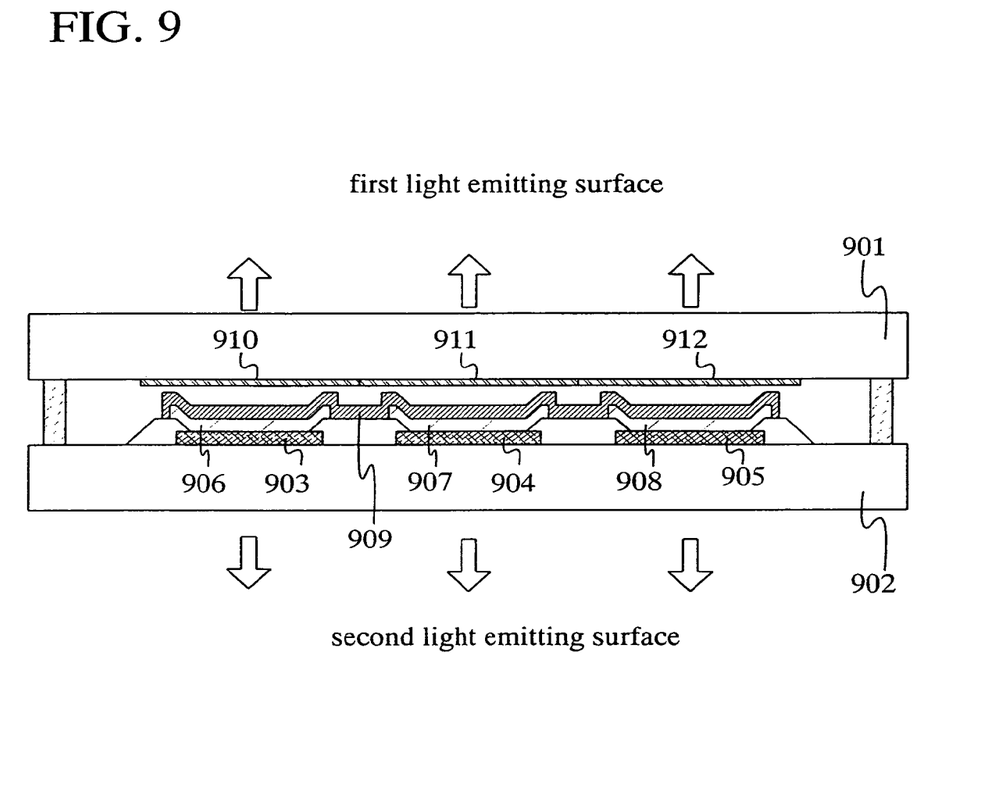
FIG. 9 is a view showing an embodiment of dual emission.

FIG. 9 shows a schematic diagram of a dual emission device used in this embodiment. In FIG. 9, transparent electrodes or electrodes based on them 903 to 905 and 909 with illuminants 906 to 908 provided therebetween are arranged between transparent substrates 901 and 902. Color filters 910 to 912 are arranged over the transparent substrate 901. In the case where the illuminants 906 to 908 emit white light, full-color display can be performed on a first light emitting surface, and white color display can be performed on a second light emitting surface. Alternatively, the luminance body having different colors may be used without the color filters. In this case, the same color can be displayed on the first light emitting surface and the second light emitting surface. A light emitting element typified by an EL element is used as the illuminant. The abovementioned dual emission display device is realized by applying such a structure.

Note that, in the dual emission device, images can be mirror reversed by using the control circuit and the memory circuit in FIG. 6. In this case, image signals can be mirror reversed by reversely reading signals of each column of the display when the memory A 604 or the memory B 605 in FIG. 6 is read. In this way, in case of a light emitting device performing subframe conversion, the above dual emission can be attained by changing order of reading memories.

Embodiment 5

The display device formed in the way as mentioned above can be used as a display portion of various electronic appliances. Hereinafter, an electronic appliance in which the display device formed by using the invention is incorporated as a display medium is explained.

A camera (a video camera, a digital camera or the like), a game machine, a car navigation, a computer, a portable information terminal (mobile computer, mobile phone, electronic book or the like) are cited as such an electronic appliance. FIGS. 11A to 11G show examples of them.

Figure 11A:
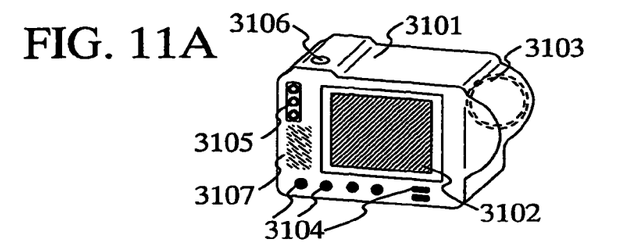
FIGS. 11A to 11G are views showing embodiments of electronic appliances using the invention.

FIG. 11A is a digital camera including a main body 3101, a display portion 3102, an image receiving portion 3103, operating keys 3104, an external connection port 3105, a shutter 3106, an audio output portion 3107 and the like. The digital camera can be formed using the display portion 3102 using the invention. According to the invention, the display portion realizing high visibility under strong outside light can be formed to provide a user-friendly digital camera.

Figure 11B:
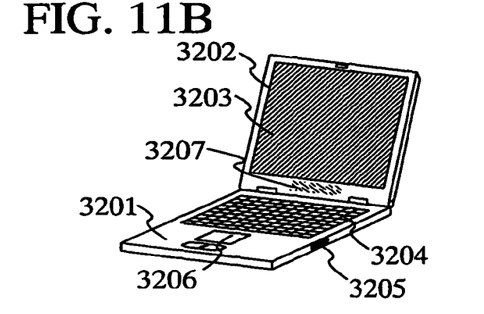

FIG. 11B is a personal computer including a main body 3201, a housing 3202, a display portion 3203, a keyboard 3204, an external connection port 3205, a pointing mouse 3206, and audio output portion 3207 and the like. The personal computer can be formed using the display portion 3203 using the invention. According to the invention, the display portion realizing high visibility under strong outside light can be formed to provide a user-friendly personal computer that causes less visual fatigue.

Figure 11C:
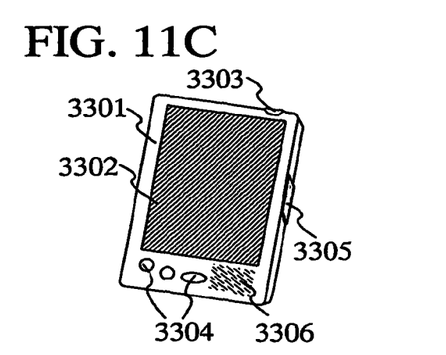

FIG. 11C is a PDA including a main body 3301, a display portion 3302, a switch 3303, operating keys 3304, an infrared radiation port 3305, an audio output portion 3306 and the like. The PDA can be formed using the display portion 3302 using the invention. According to the invention, the display portion realizing high visibility under strong outside light can be formed to provide a user-friendly PDA.

Figure 11D:
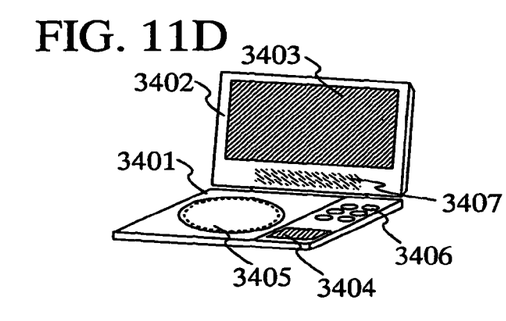

FIG. 11D is an image reproducing device comprising a record medium (specifically, a DVD reproducing device). The image reproducing device includes a main body 3401, a housing 3402, a recording medium (CD, LD, DVD or the like) reading portion 3405, an operating key 3406, an audio output portion 3407, a display portion A 3403, a display portion B 3404 and the like. On the display portion A, image information is mainly displayed, and on the display portion B, character information is mainly displayed. The image reproducing device can be formed using the display portions A 3403 and B 3404 using the invention. According to the invention, the display portion realizing high visibility under strong outside light can be formed to provide a user-friendly image reproducing device. Note that, the invention is applied to a CD reproducing device, a game machine as the image reproducing device comprising a recording medium.

Figure 11E:
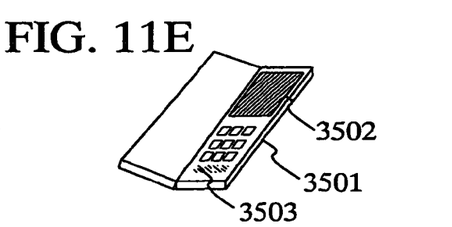

FIG. 11E is a folding portable display device. A display portion 3502 and an audio output portion 3503 are formed in a main body 3501 of the folding portable display device. The folding portable display device can be formed using the display portion 3502 using the invention. According to the invention, the display portion realizing high visibility under strong outside light can be formed to provide a user-friendly folding portable display device.

Figure 11F:
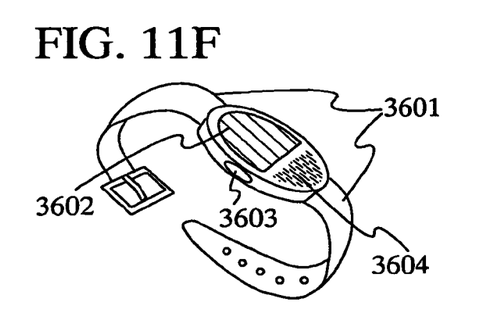

FIG. 11F is a portable information terminal that is wearable round one's arm with a belt 3601 and includes a display portion 3602, an audio output portion 3604, an operating switch 3603. With this portable information terminal, TV broadcasts can be received and seen. Besides, date and time can be displayed on the display portion 3602. The portable information terminal can be formed using the display portion 3602 using the invention. According to the invention, the display portion realizing high visibility under strong outside light can be formed to provide a user-friendly portable information terminal.

Figure 11G:
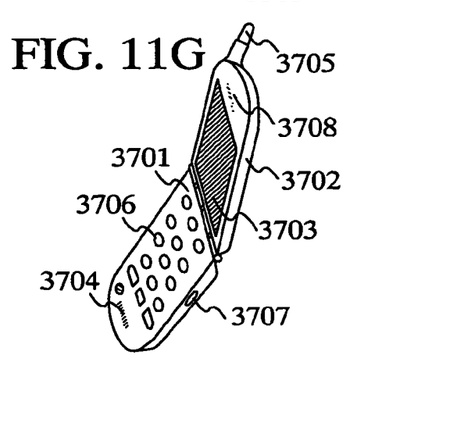

FIG. 11G is a mobile phone including a main body 3701, a housing 3702, a display portion 3703, an audio input portion 3704, an antenna 3705, an operating key 3706, an external connection port 3707, an audio output portion 3708 and the like. The mobile phone can be formed using the display portion 3703 using the invention. According to the invention, the display portion realizing high visibility under strong outside light can be formed to provide a user-friendly mobile phone.

As mentioned above, the invention is of extremely wide application so that it is applied to all fields of electronic appliances. Further, the electronic appliances of this embodiment can be realized using a formation including any combination of the embodiments 1 to 4.

What is claimed is:

1. A display device comprising:
    a display screen comprising a plurality of light emitting elements over a substrate, the plurality of light emitting elements being configured to generate light corresponding to a display image and to generate light corresponding to a background image;
    an optical sensor for detecting outside light and outputting an output signal; and
    a controller configured to control generation of light by the plurality of light emitting elements to change a luminance of the background image relative to a luminance of the display image in accordance with the output signal of the optical sensor,
    wherein one of the plurality of light emitting elements comprises a first electrode, a light emitting layer over the first electrode, and a second electrode over the light emitting layer, and
    wherein the optical sensor is formed over the second electrode,
    wherein the controller is configured to transmit a control signal, and
    wherein the display device further comprises a power supply configured to receive the control signal and respond to the control signal by increasing the luminance of the display image in a manner that utilizes an electricity left unconsumed when the background image is displayed in black.

2. The display device according to claim 1, wherein a luminance of the background image in case of outside light having a first intensity is lower than a luminance of the background image in case of outside light having a second intensity, and the first intensity is stronger than the second intensity.

3. The display device according to claim 1, wherein the optical sensor is formed over the substrate.

4. The display device according to claim 1, wherein a luminance of the background image when an intensity of outside light is 3000 Lux or more is lower than that of the background image when an intensity of outside light is less than 3000 Lux.

5. The display device according to claim 1, wherein the plurality of light emitting elements are arranged in matrix.

6. The display device according to claim 1, wherein changing the luminance of the background image relative to the luminance of the display image in accordance with the output signal of the optical sensor comprises inverting the luminance of the background image relative to the luminance of the display image in accordance with the output signal of the optical sensor.

7. The display device according to claim 1, wherein the plurality of light emitting elements and the optical sensor are formed over the same substrate.

8. The display device according to claim 1,
wherein the display screen comprises a first display screen, and
wherein a second display screen is opposed to the first display screen.

9. A display device comprising:
a display screen comprising a plurality of light emitting elements over a substrate, the plurality of light emitting elements being configured to generate light corresponding to a display image and to generate light corresponding to a background image;
an optical sensor for detecting outside light and outputting an output signal; and
a controller configured to control generation of light by the plurality of light emitting elements to change a luminance of the background image relative to a luminance of the display image in accordance with the output signal of the optical sensor,
wherein the display device further comprises a power supply configured to receive a control signal and respond to the control signal by increasing the luminance of the display image that is transmitted from the controller in a manner that utilizes an electricity left unconsumed when the background image is displayed in black.

10. The display device according to claim 9, wherein a luminance of the display image in case of outside light having a first intensity is higher than a luminance of the display image in case of outside light having a second intensity, and the first intensity is stronger than the second intensity.

11. The display device according to claim 9, wherein a luminance of the background image in case of outside light having a first intensity is lower than a luminance of the background image in case of outside light having a second intensity, and the first intensity is stronger than the second intensity.

12. The display device according to claim 9, wherein the optical sensor is formed over the substrate.

13. The display device according to claim 9, wherein a luminance of the background image when an intensity of outside light is 3000 Lux or more is lower than that of the background image when an intensity of outside light is less than 3000 Lux.

14. The display device according to claim 9, wherein a luminance of the display image when an intensity of outside light is 3000 Lux or more is higher than that of the display image when an intensity of outside light is less than 3000 Lux.

15. The display device according to claim 9, wherein the plurality of light emitting elements are arranged in matrix.

16. The display device according to claim 9, wherein changing the luminance of the background image relative to the luminance of the display image in accordance with the output signal of the optical sensor comprises inverting the luminance of the background image relative to the luminance of the display image in accordance with the output signal of the optical sensor.

17. The display device according to claim 9, wherein the plurality of light emitting elements and the optical sensor are formed over the same substrate.

18. A display device comprising:
a display screen comprising a plurality of light emitting elements over a substrate, on which a display image and a background image are displayed;
an optical sensor for detecting outside light and outputting output signal; and
a controller for controlling luminance of at least a first one of the plurality of light emitting elements corresponding to the background image in accordance with the output signal of the optical sensor and controlling luminance of at least a second one of the plurality of light emitting elements corresponding to the display image in accordance with the output signal of the optical sensor,
wherein the controlled luminance of the at least first one of the plurality of light emitting elements is controlled to be relatively different from the controlled luminance of the at least second one of the plurality of light emitting elements,
wherein the controller comprises a combination of at least one control circuit,
wherein the controller is configured to transmit a control signal, and
wherein the display device further comprises a power supply configured to receive the control signal and respond to the control signal by increasing the luminance of the display image in a manner that utilizes an electricity left unconsumed when the background image is displayed in black.

19. The display device according to claim 18, wherein a luminance of the at least first one of the plurality of light emitting elements corresponding to the background image in case of outside light having a first intensity is lower than a luminance of the at least first one of the plurality of light emitting elements corresponding to the background image in case of outside light having a second intensity, and the first intensity is stronger than the second intensity.

20. The display device according to claim 18, wherein a luminance of the at least second one of the plurality of light emitting elements corresponding to the display image in case of a outside light having first intensity is higher than a luminance of the at least second one of the plurality of light emitting elements corresponding to the display image in case of outside light having a second intensity, and the first intensity is stronger than the second intensity.

21. The display device according to claim 18, wherein the optical sensor is formed over the substrate.

22. The display device according to claim 18, wherein a luminance of the at least first one of the plurality of light emitting elements corresponding to the background image when an intensity of outside light is 3000 Lux or more is lower than that of the background image when an intensity of outside light is less than 3000 Lux.

23. The display device according to claim 18, wherein a luminance of the at least second one of the plurality of light emitting elements corresponding to the display image when an intensity of outside light is 3000 Lux or more is higher than that of the display image when an intensity of outside light is less than 3000 Lux.

24. The display device according to claim 18, wherein the plurality of light emitting elements are arranged in matrix.

25. The display device according to claim 18, wherein the controlled luminance of the at least first one of the plurality of light emitting elements being controlled to be relatively different from the controlled luminance of the at least second one of the plurality of light emitting elements comprises the controlled luminance of the at least first one of the plurality of light emitting elements being controlled to be inverted relative to the controlled luminance of the at least second one of the plurality of light emitting elements.

26. The display device according to claim 18, wherein the plurality of light emitting elements and the optical sensor are formed over the same substrate.

27. An electronic appliance comprising:
a display screen comprising a plurality of light emitting elements over a substrate, the plurality of light emitting elements being configured to generate light corresponding to a display image and to generate light corresponding to a background image;
an optical sensor for detecting outside light and outputting an output signal; and
a controller configured to control generation of light by the plurality of light emitting elements to change a luminance of the background image relative to a luminance of the display image in accordance with the output signal of the optical sensor,
wherein one of the plurality of light emitting elements comprises a first electrode, a light emitting layer over the first electrode, and a second electrode over the light emitting layer, and
wherein the optical sensor is formed over the second electrode,
wherein the controller is configured to transmit a control signal, and
wherein the electronic appliance further comprises a power supply configured to receive the control signal and respond to the control signal by increasing the luminance of the display image in a manner that utilizes an electricity left unconsumed when the background image is displayed in black.

28. The electronic appliance according to claim 27, wherein a luminance of the background image in case of outside light having a first intensity is lower than a luminance of the background image in case of outside light having a second intensity, and the first intensity is stronger than the second intensity.

29. The electronic appliance according to claim 27, wherein the optical sensor is formed over the substrate.

30. The electronic appliance according to claim 27, wherein the electronic appliance is one selected from the group consisting of a camera, a game machine, a car navigation, a computer, and a portable information terminal.

31. The electronic appliance according to claim 27, wherein a luminance of the background image when an intensity of outside light is 3000 Lux or more is lower than that of the background image when an intensity of outside light is less than 3000 Lux.

32. The electronic appliance according to claim 27, wherein the plurality of light emitting elements are arranged in matrix.

33. The electronic appliance according to claim 27, wherein changing the luminance of the background image relative to the luminance of the display image in accordance with the output signal of the optical sensor comprises inverting the luminance of the background image relative to the luminance of the display image in accordance with the output signal of the optical sensor.

34. The electronic appliance according to claim 27, wherein the plurality of light emitting elements and the optical sensor are formed over the same substrate.

35. An electronic appliance comprising:
a display screen comprising a plurality of light emitting elements over a substrate, the plurality of light emitting elements being configured to generate light corresponding to a display image and to generate light corresponding to a background image are displayed;
an optical sensor for detecting outside light and outputting an output signal; and
a controller configured to control generation of light by the plurality of light emitting elements to change a luminance of the background image relative to a luminance of the display image in accordance with the output signal of the optical sensor,
wherein the electronic appliance further comprises a power supply configured to receive a control signal and respond to the control signal by increasing the luminance of the display image that is transmitted from the controller in a manner that utilizes an electricity left unconsumed when the background image is displayed in black.

36. The electronic appliance according to claim 35, wherein a luminance of the display image in case of outside light having a first intensity is higher than a luminance of the display image in case of outside light having a second intensity, and the first intensity is stronger than the second intensity.

37. The electronic appliance according to claim 35, wherein a luminance of the background image in case of outside light having a first intensity is lower than a luminance of the background image in case of outside light having a second intensity, and the first intensity is stronger than the second intensity.

38. The electronic appliance according to claim 35, wherein the optical sensor is formed over the substrate.

39. The electronic appliance according to claim 35, wherein the electronic appliance is one selected from the group consisting of a camera, a game machine, a car navigation, a computer, and a portable information terminal.

40. The electronic appliance according to claim 35, wherein a luminance of the background image when an intensity of outside light is 3000 Lux or more is lower than that of the background image when an intensity of outside light is less than 3000 Lux.

41. The electronic appliance according to claim 35, wherein a luminance of the display image when an intensity of outside light is 3000 Lux or more is higher than that of the display image when an intensity of outside light is less than 3000 Lux.

42. The electronic appliance according to claim 35, wherein the plurality of light emitting elements are arranged in matrix.

43. The electronic appliance according to claim 35, wherein changing the luminance of the background image relative to the luminance of the display image in accordance with the output signal of the optical sensor comprises inverting the luminance of the background image relative to the luminance of the display image in accordance with the output signal of the optical sensor.

44. The electronic appliance according to claim 35, wherein the plurality of light emitting elements and the optical sensor are formed over the same substrate.

45. An electronic appliance comprising:
a display screen comprising a plurality of light emitting elements over a substrate, on which a display image and a background image are displayed;
an optical sensor for detecting outside light and outputting an output signal; and
a controller for controlling luminance of at least a first one of the plurality of light emitting elements corresponding to the background image in accordance with the output signal of the optical sensor and controlling luminance of at least a second one of the plurality of light emitting elements corresponding to the display image in accordance with the output signal of the optical sensor,
wherein the controlled luminance of the at least first one of the plurality of light emitting elements is controlled to be relatively different from the controlled luminance of the at least second one of the plurality of light emitting elements, and
wherein the controller comprises a combination of at least one control circuit,
wherein the controller is configured to transmit a control signal, and
wherein the electronic appliance further comprises a power supply configured to receive the control signal and respond to the control signal by increasing the luminance of the display image in a manner that utilizes an electricity left unconsumed when the background image is displayed in black.

46. The electronic appliance according to claim 45, wherein a luminance of the at least first one of the plurality of light emitting elements corresponding to the background image in case of outside light having a first intensity is lower than a luminance of the at least first one of the plurality of light emitting elements corresponding to the background image in case of outside light having a second intensity, and the first intensity is stronger than the second intensity.

47. The electronic appliance according to claim 45, wherein a luminance of the at least second one of the plurality of light emitting elements corresponding to the display image in case of a outside light having first intensity is higher than a luminance of the at least second one of the plurality of light emitting elements corresponding to the display image in case of outside light having a second intensity, and the first intensity is stronger than the second intensity.

48. The electronic appliance according to claim 45, wherein the optical sensor is formed over the substrate.

49. The electronic appliance according to claim 45, wherein the electronic appliance is one selected from the group consisting of a camera, a game machine, a car navigation, a computer, and a portable information terminal.

50. The electronic appliance according to claim 45, wherein a luminance of the at least first one of the plurality of light emitting elements corresponding to the background image when an intensity of outside light is 3000 Lux or more is lower than that of the background image when an intensity of outside light is less than 3000 Lux.

51. The electronic appliance according to claim 45, wherein a luminance of the at least second one of the plurality of light emitting elements corresponding to the display image when an intensity of outside light is 3000 Lux or more is higher than that of the display image when an intensity of outside light is less than 3000 Lux.

52. The electronic appliance according to claim 45, wherein the plurality of light emitting elements are arranged in matrix.

53. The electronic appliance according to claim 45, wherein the controlled luminance of the at least first one of the plurality of light emitting elements being controlled to be relatively different from the controlled luminance of the at least second one of the plurality of light emitting elements comprises the controlled luminance of the at least first one of the plurality of light emitting elements being controlled to be inverted relative to the controlled luminance of the at least second one of the plurality of light emitting elements.

54. The electronic appliance according to claim 45, wherein the plurality of light emitting elements and the optical sensor are formed over the same substrate.

* * * * *